United States Patent
Cideciyan et al.

(10) Patent No.: US 7,876,516 B2
(45) Date of Patent: Jan. 25, 2011

(54) REWRITE-EFFICIENT ECC/INTERLEAVING FOR MULTI-TRACK RECORDING ON MAGNETIC TAPE

(75) Inventors: Roy D. Cideciyan, Rueschlikon (CH);
Evangelos S. Eleftheriou, Zurich (CH);
Hisato Matsuo, Yokohama (JP);
Thomas Mittelholzer, Zurich (CH);
Paul J. Seger, Tucson, AZ (US);
Keisuke Tanaka, Tokyo-to (JP)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 12/351,747

(22) Filed: Jan. 9, 2009

(65) Prior Publication Data
US 2010/0177422 A1 Jul. 15, 2010

(51) Int. Cl.
*G11B 5/09* (2006.01)
*G11B 20/14* (2006.01)

(52) U.S. Cl. ...................................... 360/40
(58) Field of Classification Search ............ 360/40, 360/39, 77.12, 78.02, 134; 714/771, 755, 714/761, 810; 375/240.26, 295; 341/59
See application file for complete search history.

(56) References Cited

U.S. PATENT DOCUMENTS

| | | | | |
|---|---|---|---|---|
| 4,336,612 A | * | 6/1982 | Inoue et al. | 714/755 |
| 6,539,514 B1 | * | 3/2003 | Bartlett | 714/761 |
| 7,378,994 B1 | * | 5/2008 | Tseng et al. | 341/59 |
| 2006/0107173 A1 | | 5/2006 | Kondou | |
| 2008/0112502 A1 | * | 5/2008 | Limberg | 375/295 |
| 2008/0235556 A1 | * | 9/2008 | Eleftheriou et al. | 714/755 |
| 2008/0235562 A1 | * | 9/2008 | Eleftheriou et al. | 714/810 |
| 2009/0003459 A1 | * | 1/2009 | Limberg | 375/240.26 |
| 2010/0177420 A1 | * | 7/2010 | Cideciyan et al. | 360/39 |
| 2010/0180180 A1 | * | 7/2010 | Cideciyan et al. | 714/771 |

FOREIGN PATENT DOCUMENTS

EP    1 850 342 A1    10/2007

OTHER PUBLICATIONS

Standard ECMA-319: "Data Interchange on 12,7 mm 384-Track Magnetic Tape Cartridges—Ultrium-1 Format"; Jun. 2001.

* cited by examiner

*Primary Examiner*—Fred Tzeng
(74) *Attorney, Agent, or Firm*—Dan Shifrin

(57) ABSTRACT

For writing data to multi-track tape, a received data set is received and segmented into unencoded subdata sets, each comprising an array having $K_2$ rows and $K_1$ columns. For each unencoded subdata set, $N_1$-$K_1$ C1-parity bytes are generated for each row and $N_2$-$K_2$ C2-parity bytes are generated for each column. The C1 and C2 parity bytes are appended to the ends of the row and column, respectively, to form encoded C1 and C2 codewords, respectively. All of the C1 codewords per data set are endowed with a specific codeword header to form a plurality of partial codeword objects (PCOs). Each PCO is mapped onto a logical data track according to information within the header. On each logical data track, adjacent PCOs are merged to form COs which are modulation encoded and mapped into synchronized COs. Then T synchronized COs are written simultaneously to the data tape where T is the number of concurrent active tracks on the data tape.

35 Claims, 11 Drawing Sheets

ECC/PCO-Interleaving Scheme

Encoded subdata set

Unencoded subdata set

C2-encoder for [96, 84, 13]-RS code

Codeword Object for LTO-4 data format

Layout of COs of SDS #0 and SDS #1 along T=16 tracks

Fig. 8: Partial Codeword Object for alternative data format

| Header | CWI-4 |
|---|---|
| 12 | 960 |

| Header | CWI-4 | Header | CWI-4 |
|---|---|---|---|
| 12 bytes | 960 bytes | 12 bytes | 960 bytes |

Alternative Codeword Object

FIG. 10

| VFO | Fwd Sync | Header | CWI-2 | Re-Sync | CWI-2 | Header | Rev Sync |
|---|---|---|---|---|---|---|---|
| 255 | 17 | 85 | 4080 | 34 | 4080 | 85 | 17 |

FIG. 12

Synchronized Codeword Object for LTO-4 Data Format

| VFO | Fwd Sync | Header | CWI-4 | Re-Sync | CWI-4 | Header | Rev Sync |
|---|---|---|---|---|---|---|---|
| $L_{VFO}$ | $L_{FS}$ | 10×8/$R_H$ | 960×8/R | $L_{RS}$ | 960×8/R | 10×8/$R_H$ | $L_{FS}$ |

FIG. 13

Alternative Synchronized Codeword Object

REWRITE-EFFICIENT ECC/INTERLEAVING FOR MULTI-TRACK RECORDING ON MAGNETIC TAPE

RELATED APPLICATION DATA

The present application is related to commonly-assigned and co-pending U.S. application Ser. No. 12/351,738 entitled ECC INTERLEAVING FOR MULTI-TRACK RECORDING ON MAGNETIC TAPE, and Ser. No. 12/351,756 entitled REWRITING CODEWORD OBJECTS TO MAGNETIC DATA TAPE UPON DETECTION OF AN ERROR, both filed on the same date as the present application, which related applications are hereby incorporated herein by reference in their entireties.

TECHNICAL FIELD

The present invention relates generally to formatting data to be recorded onto magnetic tape and, in particular, to an adjustable ECC format and interleaving process to accommodate tape drives having a multiple of eight transducers/sensors per head to read and write from/to a multiple of eight number of tracks simultaneously.

BACKGROUND ART

The Linear Tape Open (LTO) formats Generations 3 and 4 use error-correcting codes (ECC), which are based on a 2-dimensional product code. The C1-code is arranged along the rows of the 2-dimensional array. It is an even/odd interleaved Reed-Solomon (RS) code of length 240 giving rise to a row of length 480. The C2-code is arranged along the columns of the array. It is a RS-code of length 64 and dimension 54. The codewords are 2-dimensional arrays of size 64×480 and they are called subdata sets in the LTO standard. It is anticipated that future generation of drives will write on more than 16 tracks simultaneously. However, all current generations of LTO formats (Gen-1 to Gen-4) are based on the above C2 coding scheme which, together with its associated interleaving, cannot accommodate future tape-drive systems that will support heads with 16, 24, 32 or 48 (or other multiple of eight) transducers/sensors per head to read/write 16, 24, 32 or 48 (or other multiple of eight) concurrent tracks, respectively. Furthermore, it is expected that future generations of drives will use longer subdata sets having rows, which consists of 4-way codeword interleaves (CWI-4) of length 960 instead of the 2-way even/odd codeword interleaves (CWI-2), which are called codeword pairs of the LTO format (Gen-1 to Gen-4). In LTO Gen-1 to Gen-4, these CWI-2s are endowed with codeword pair headers and grouped into pairs to form codeword objects (CO). When a write failure occurs, entire COs are rewritten. If the same CO-rewrite strategy is applied to subdata set rows consisting of CWI-4s, there is a loss in efficiency because most often only one of the two CWI-4s per CO had a failure and the other CWI-4 would not need to be rewritten. Since CWI-4s are twice as long as CWI-2s, the loss in efficiency is about twice as large in the former case as in the latter.

SUMMARY OF THE INVENTION

The present invention provides methods, apparatus and computer program product for writing data to multi-track tape. In one embodiment, a method comprises receiving a stream of user data symbols, the stream comprising a data set and segmenting the data set into a plurality S of unencoded subdata sets, each subdata set comprising an array having $K_2$ rows and $K_1$ columns. For each unencoded subdata set, $N_1-K_1$ C1-parity bytes are generated for each row of a subdata set which are appended to the end of the row to form an encoded C1 codeword having a length $N_1$. Similarly, for each unencoded subdata set, $N_2-K_2$ C2-parity bytes are generated for each column of the subdata set which are appended to the end of the column to form an encoded C2 codeword having a length $N_2$, whereby an encoded subdata set is generated having $N_2$ C1 codewords. All the $S \times N_2$ C1 codewords per data set are endowed with a specific codeword header to form a plurality of $S \times N_2$ partial codeword objects (PCOs). Each PCO is mapped onto a logical data track according to information within the headers of the PCO. On each logical data track, adjacent PCOs are merged to form COs, each comprising at least two adjacent PCOs. Each CO is modulation encoded and mapped into a synchronized CO by adding various synchronization patterns. T synchronized COs are then written simultaneously to the tape, where T equals the number of concurrent active tracks on the tape.

In another embodiment, a data storage tape device comprises a host interface through which a stream of user data symbols comprising a data set is received and a segmenting module operable to segment the data set into a plurality S of unencoded subdata sets, each subdata set comprising a array having $K_2$ rows and $K_1$ columns. A C1 encoder is operable to generate $N_1-K_1$ C1 parity bytes for each row of a subdata set and append the C1 parity bytes to the end of the row to form an encoded C1 codeword having a length $N_1$ and a C2 encoder is operable to generate $N_2-K_2$ C2 parity bytes for each column of the subdata set and append the C2 parity bytes to the end of the column to form an encoded C2 codeword having a length $N_2$, whereby an encoded subdata set is generated having $N_2$ C1 codewords. A partial codeword object formatter is operable to form a plurality of $(S \times N_2)$ partial codeword objects (PCOs) from the S encoded subdata sets, each PCO comprising a header and a C1 codeword. A partial codeword object interleaver is operable to map each PCO onto a logical data track according to information within the headers of the PCO. A codeword object formatter is operable, on each logical data track, to merge adjacent PCOs into COs, each comprising at least two adjacent PCOs. A modulation encoder is operable to encode the COs into synchronized COs that contain various sync patterns in addition to modulation encoded COs. A write channel, including a write head, is operable to write T synchronized COs simultaneously to the tape, where T equals the number of concurrent active tracks on the tape.

BRIEF DESCRIPTION OF THE DRAWINGS

FIG. 8 illustrates a PCO of the present invention;

FIG. 10 illustrates an alternative CO of the present invention;

FIG. 12 illustrates a synchronized CO of the LTO Gen-4 data format; and

FIG. 13 illustrates an alternative synchronized CO of the present invention.

DETAILED DESCRIPTION OF THE PREFERRED EMBODIMENT

Some of the functional units described in this specification have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like. Modules may also be implemented in software for execution by various types of processors. An identified module of executable code may, for instance, comprise one or more physical or logical blocks of computer instructions which may, for instance, be organized as an object, procedure, or function. A module of executable code could be a single instruction, or many instructions, and may even be distributed over several different code segments, among different programs and across several memory devices.

Furthermore, the described features, structures, or characteristics of the invention may be combined in any suitable manner in one or more embodiments. In the following description, numerous specific details are provided, such as examples of programming, software modules, hardware modules, hardware circuits, etc., to provide a thorough understanding of embodiments of the invention. One skilled in the relevant art will recognize, however, that the invention can be practiced without one or more of the specific details, or with other methods, components and so forth. In other instances, well-known structures, materials, or operations are not shown or described in detail to avoid obscuring aspects of the invention.

Figure 1:
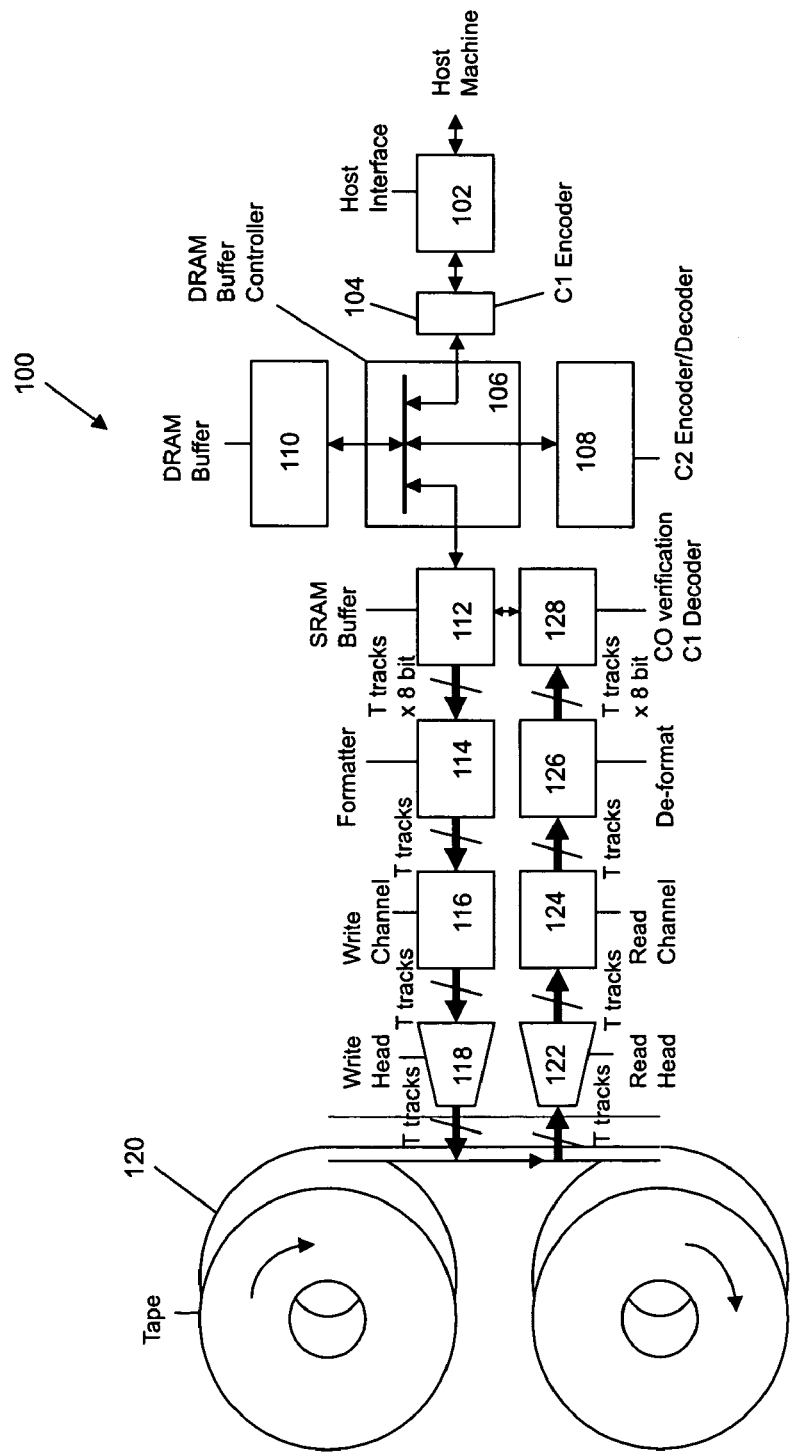
FIG. 1 is a block diagram of a magnetic tape drive with which the present invention may be implemented.

FIG. 1 is a high level block diagram of a data tape drive 100 in which the present invention may be incorporated. Data to be recorded is transmitted from a host (not shown) to the drive 100 through a host interface 102. The data undergoes a first encoding in a C1 encoder 104 and passed to a DRAM buffer controller 106. The C1-encoded data undergoes a second encoding in a C2 encoder 108 and is stored in a DRAM buffer 110. The data is subsequently stored in an SRAM buffer 112 and formatted in a formatter 114. Formatted data is sent to a write channel and then to a write head 118 which records the data onto the tape 120.

When the data is read back from the tape 120, a read head 122 detects the data and passes it to a read channel. The data is then processed in a de-formatter 126 and COs are verified in a verifier 128. The data is then decoded and sent to the requesting host.

Figure 2:
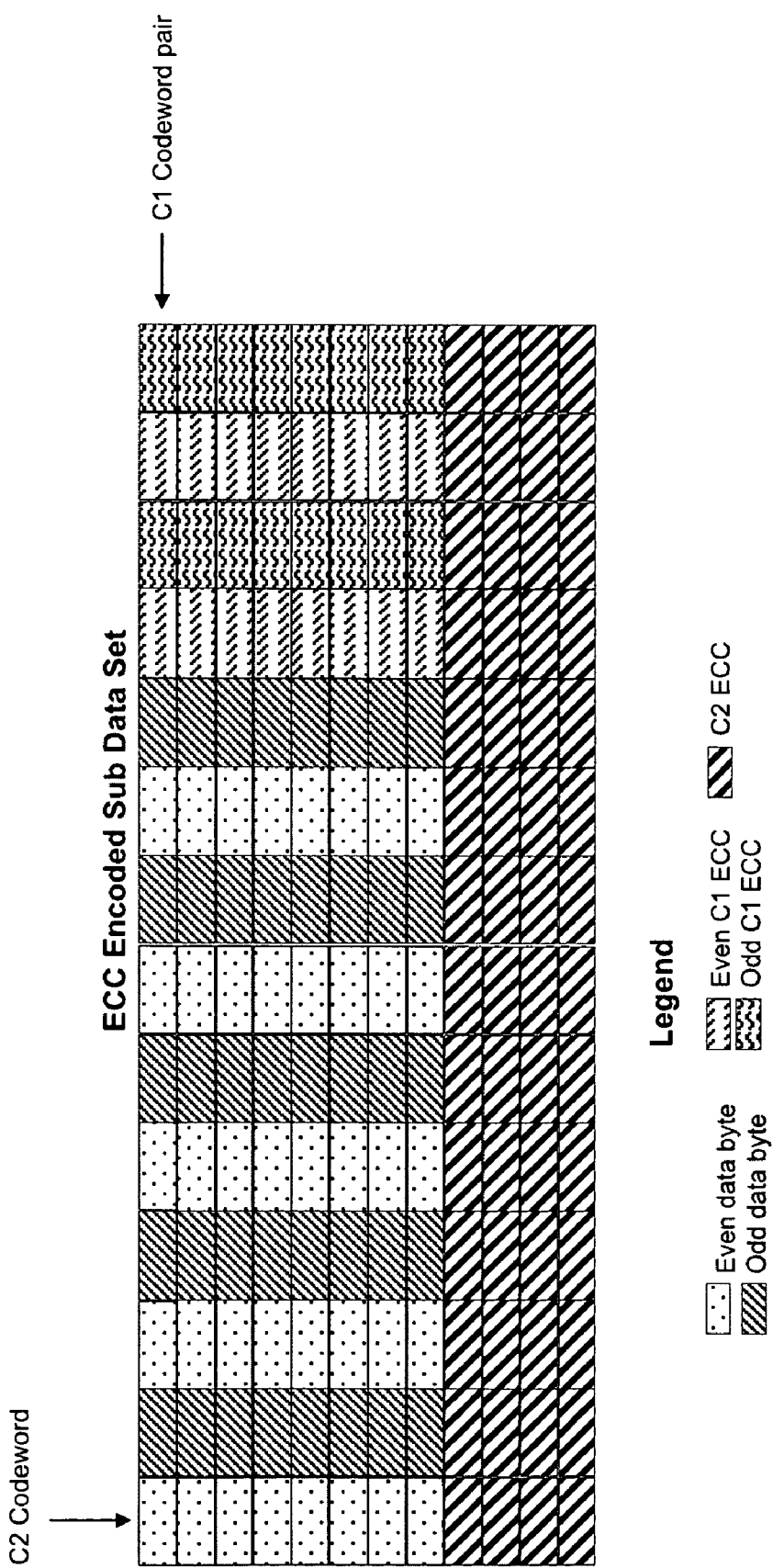
FIG. 2 is a schematic representation of an encoded subdata set, including interleaved C1 and C2 ECC.

The Linear Tape Open (LTO) format is based on the concept of data sets (the smallest unit written to tape) and subdata sets. A data set contains two types of data: user data and administrative information about the data set, the latter being in a Data Set Information Table (DSIT). All data is protected by an error correction code (ECC) to minimize data loss due to errors or defects. A data set comprises a number of subdata sets, each containing data arranged in rows. A subdata set row may contain user data or contain the DSIT. As illustrated in FIG. 2, each row consists of two interleaved byte sequences. A first level ECC (C1 ECC) is computed separately for the even bytes and for the odd bytes for each row. The resulting C1 ECC even and odd parity bytes are appended to the corresponding row, also in an interleaved fashion. The ECC protected row is the Codeword Pair (CWP). The even bytes form the even C1 Codeword while the odd bytes form the odd C1 Codeword. A second level ECC (C2 ECC) is computed for each column and the resulting C2 ECC parity bytes are appended to the corresponding columns. The ECC protected column is a C2 Codeword.

The subdata set, when so protected by C1 and C2 ECC, is the smallest ECC-protected unit written to tape. Each subdata set is independent with respect to ECC; that is, errors in a subdata set affect only that subdata set. The power of any ECC algorithm depends upon the number of parity bytes and is stated in terms of its correction capability. For a given number of $N_1-K_1$ C1-parity bytes computed for a C1 codeword, up to floor($(N_1-K_1)/4$) errors may be corrected in each of the two interleaves of that codeword, where floor(x) denotes the integer part of the real number x. And, for a given number of $N_2-K_2$ C2-parity bytes computed for a C2 codeword, up to floor($(N_2-K_2)/2$) errors or $N_2-K_2$ erasures may be corrected in that C2 Codeword.

It will be appreciated that multiple errors in the same subdata set can overwhelm the ability of the C1 or the C2 correction power to the extent that an error occurs when the data is read. Errors may be caused by very small events such as small particles or small media defects. Errors may also be caused by larger events such as scratches, tracking errors or mechanical causes.

To mitigate the possibility that a single large error will affect multiple Codewords in a single subdata set, some methods of writing place Codewords from each subdata set as far apart as possible along and across the tape surface. A single error would therefore have to affect multiple Codewords from the same subdata set before the ECC correction capability is overwhelmed. Spatial separation of Codewords from the same subdata set reduces the risk and is accomplished in the following manner for a multi-track recording format. For each track of a set of tracks being recorded simultaneously, a Codeword Quad (CQ) is formed by combining a Codeword Pair from one subdata set with a Codeword Pair from a different subdata set. The resulting CQ is written on one of the multiple recorded tracks. In like manner, CQs are formed for all remaining tracks by combining Codeword Pairs, all Codeword Pairs being from differing subdata sets. The group of CQs written simultaneously is called a CQ Set.

Figure 3:
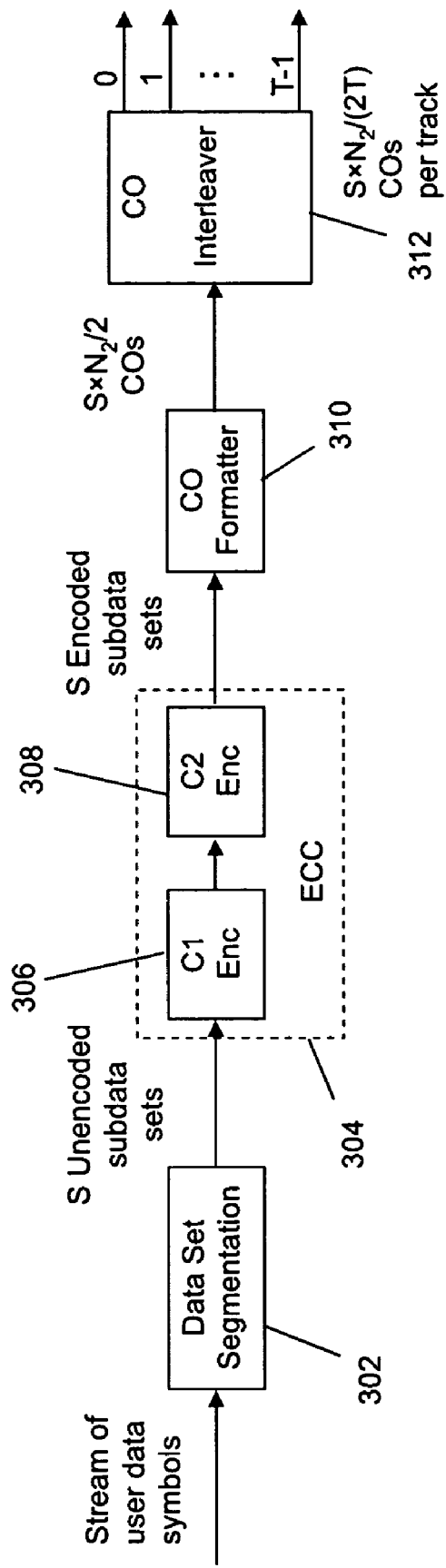
FIG. 3 is a block diagram of components generalizing the LTO Gen-4 standard used to form data sets layouts from a stream of user data symbols.
Figures 4A, 4B:
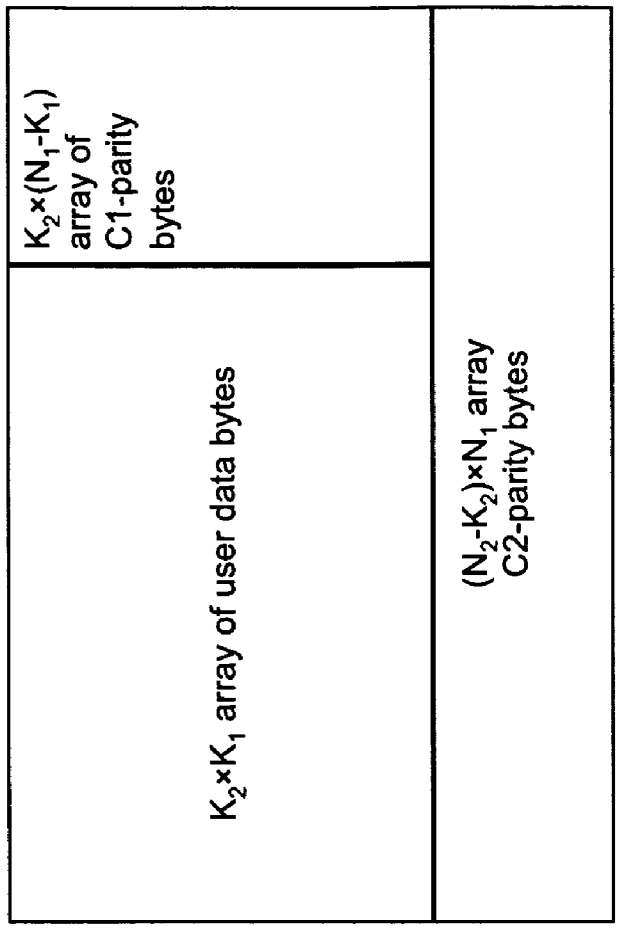
FIGS. 4A and 4B are schematic representations of unencoded and encoded subdata sets, respectively.

As illustrated in the block diagram of FIG. 3, data sets of a specified fixed size are formed by segmentation of a stream of user data symbols in a data set segmentation module 302. The data set is further partitioned into S unencoded subdata sets. The subdata set structure is matched to an ECC module 304, which is based on a C1/C2 product code. The unencoded subdata sets comprise 2-dimensional arrays of bytes of size $K_2 \times K_1$, where $K_1$ and $K_2$ are the dimensions of the C1 and C2 code, respectively (FIG. 4A). A C1-encoder 306 operates on rows and adds parity bytes in each row. A C2-encoder 308 operates on the C1-encoded columns and appends parity in each column. The resulting C1/C2-encoded subdata set is an $N_2 \times N_1$ array of bytes, where $N_1$ and $N_2$ are the lengths of the C1 and C2 codes, respectively (FIG. 4B).

Figure 5:
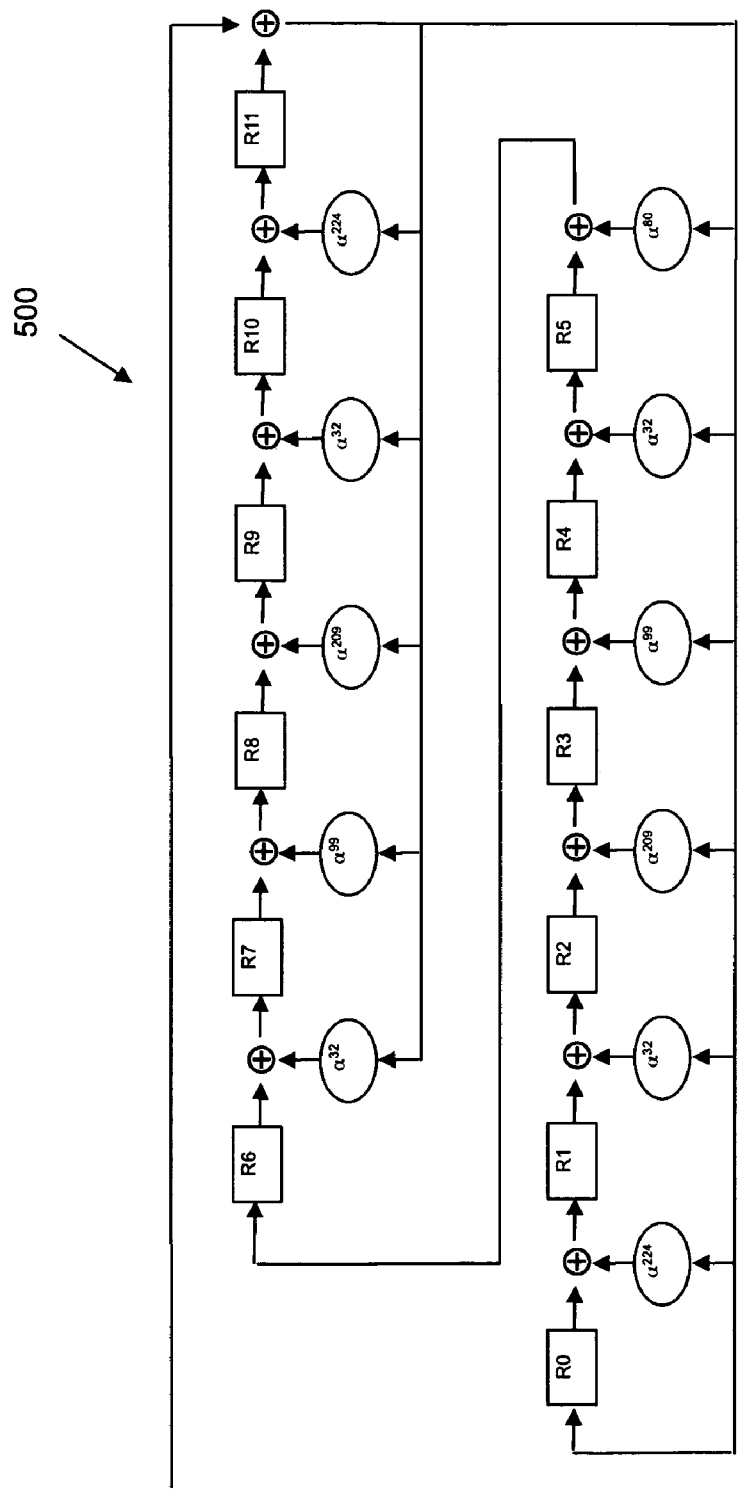
FIG. 5 is a logic diagram of a C2-encoder for a [96, 84, 13]-RS code which may be used with the present invention.

The encoding by the C2 encoder 308 may be performed by a linear feedback shift register (LFSR) 500 as shown in FIG. 5, whose feedback coefficients are given by the generator polynomial of the [96, 84, 13]-RS code. The initial state of the LFSR 500 is the all-zero state. The $N_2-K_2=12$ parity bytes of an RS codeword are obtained by clocking all the systematic $K_2=84$ data bytes through the LFSR and reading out registers R0 to R11.

In LTO-3/4, S=64 subdata sets (or codewords) form a data set (DS), the C1 code has length $N_1=480$ and the C2 code has length $N_2=64$. The C1-codewords within a DS are fully determined by the subdata set (SDS) number (in the range from 0 to S−1) and by the row number within the subdata set (codeword array). In LTO-3/4, this assignment is called codeword pair designation. It is determined by the following expression:

$$\text{C1-codeword\_number}=\text{SDS\_number}+64\times\text{row\_number}, \quad (1)$$

where SDS_number=0, 1, 2, . . . , S−1 and row_number=0, 1, . . . , 63. For LTO-3/4, the C1-codeword_number index takes values from 0 to 4095.

Figure 6:
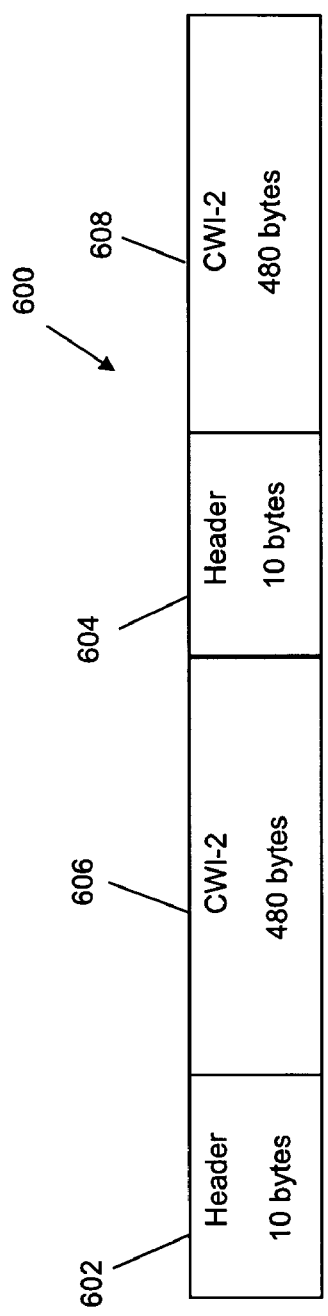
FIG. 6 illustrates a codeword object (CO) of the LTO Gen-4 data format.

A structure 600 as shown in FIG. 6 is a Codeword Object (CO) structure and reflects the organization of the basic unit that includes C1-codewords and associated headers.

From the ECC module 304, a CO formatter 310 forms COs consisting of two 10-byte headers 602, 604 and of two C1-codewords 606, 608 out of the $S \times N_2=4096$ C1-codewords per DS. Thus, there are $S \times N_2/2=2048$ COs, which are numbered from 0 to 2047. The CO structure 600 with index CO_number contains the two C1-codewords with indices C1-codeword_number that are related as follows. The indices C1-codeword_number_0 and C1-codeword_number_1 of the first and second C1-codewords, respectively, are given by $$\text{C1-codeword\_number\_0}=2\times\text{CO\_number} \quad (2)$$

$$\text{C1-codeword\_number\_1}=2\times\text{CO\_number}+1. \quad (3)$$

Therefore, two C1-codewords in an CO are taken from two SDSs with consecutive SDS_number indices.

The COs are written simultaneously onto the tape in batches of T COs, where T is the number of concurrent active tracks. The CO-interleaver 312 assigns a logical track number t in the range 0, 1, . . . , T−1 to each CO of the DS. Thus, the $S \times N_2/2$ COs of a DS are grouped into batches of T COs based on their consecutive CO_number indices and then these batches are written onto the T active tracks. Thereby, one CO of each batch is written onto one of the T tracks in a one-to-one fashion, which is determined by the CO-interleaver 312.

The CO-interleaver is determined by assigning to each CO with index n=CO_number a logical track number t based on the formula $$t=\text{mod}(7 \text{ floor}(2n/S)+n, T) \quad (4)$$

where floor(x) denotes the integer part of the real number x and mod(a,T) denotes the remainder of the division by T, where the remainder is in the range 0,1, . . . , T−1.

Figure 7:
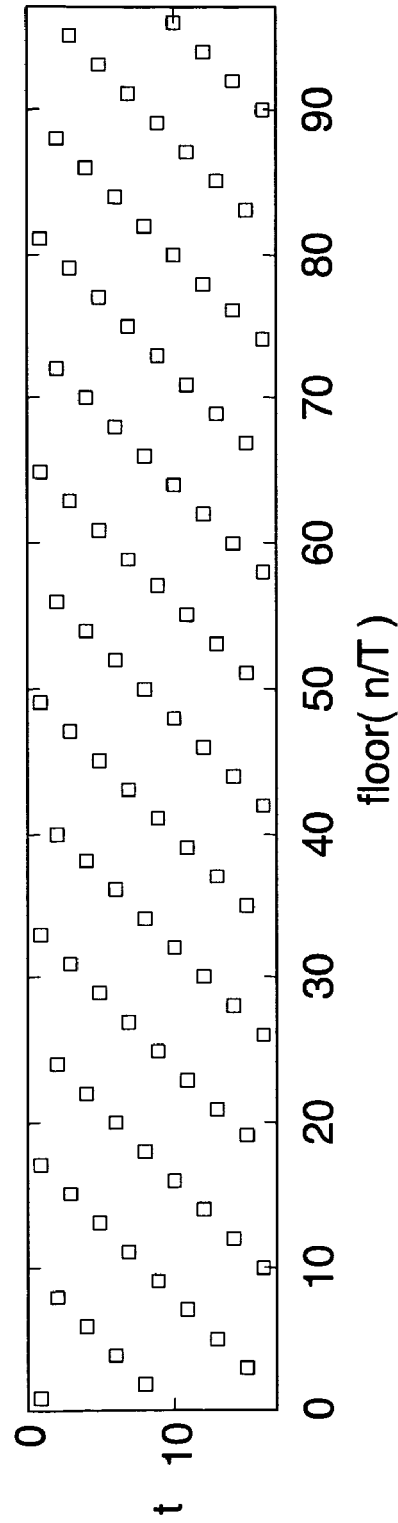
FIG. 7 illustrates an example of a distribution of subdata sets along 16 tracks of recording media based on CO-interleaving.

In FIG. 7, the result of CO-interleaving based on formula (4) above is illustrated for a DS with S=32 SDSs by showing the data set layout along T=16 logical tracks. The 96 squares correspond to the 96 COs of the SDSs with SDS_number 0 and 1. Note that the interleaver-granularity along tape is a CO, i.e., the x-axis is measured in CO lengths. As T=16 tracks are written concurrently, the CO with CO_number=n will be at location j=floor(n/T) from the beginning of the DS.

Because of re-write considerations, it is desirable to have smaller re-write units than COs. For this reason, one defines a Partial Codeword Object (PCO), as illustrated in FIG. 8, to consist of a CWI together with a CWI header, which contains the corresponding CWI_number (which is 4 in the FIG) specified by formula (4).

Figure 9:
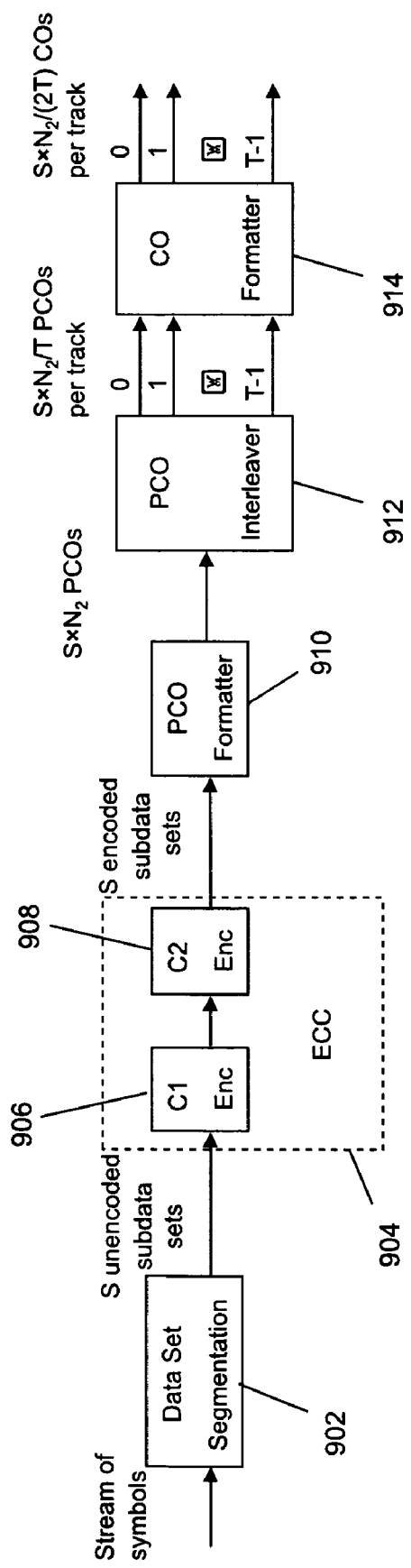
FIG. 9 is a block diagram of components of the present invention used to form data sets layouts from a stream of user data symbols.

The data flow in the write path with PCO-interleaving is illustrated in FIG. 9. As with the data flow set forth in FIG. 3, data sets of a specified fixed size are formed by segmentation of a stream of user data symbols in a data set segmentation module 902. The data set is further partitioned into S unencoded subdata sets. The subdata set structure is matched to an ECC module 904, which is based on a C1/C2 product code. A C1-encoder 906 operates on rows and adds parity bytes in each row and a C2-encoder 908 operates on the C1-encoded columns and appends parity in each column to generate the C1/C2-encoded subdata sets.

From the ECC module 904, a PCO formatter 910 forms PCOs. The PCO illustrated in FIG. 8 consists of a 12-byte CWI header and a 960-byte CWI.

As there are $S \times N_2$ CWIs per data set, there are also $S \times N_2$ PCOs per data set. Each PCO is mapped onto a logical data track according to information within the headers of the PCO.

A PCO-interleaver 912 operates on PCOs and maps them onto T concurrent logical tracks. On each logical data track, adjacent PCOs are merged in a CO formatter 914 to form COs, each comprising at least two adjacent PCOs. Thus, the PCO-interleaver 912 operates before the CO formatter 914, which groups pairs of adjacent PCOs along the same track into COs (see FIG. 10).

The PCO-interleaver 912 is determined by assigning to each PCO with index m=CWI_number a logical track number t based on the formula $$t=\text{mod}(7 \text{ floor}(m/S)+m, T). \quad (5)$$

A more general PCO-interleaver is obtained by using the formula $$t=\text{mod}(7 \text{ floor}(f(m)/S)+g(m), T). \quad (6)$$

with predefined functions f(.) and g(.). Formula (5) is a special case of (6) in which f(m)=m and g(m)=m. Another interesting case of the general formula is $$t=\text{mod}(7 \text{ floor}(m/S)+\text{floor}(m/2), T). \quad (7)$$

Note that (7) is obtained from (4) by using the relation of the CWI index m=CWI_number to the CO index n=CO_number given in (2) and (3).

Figure 11:
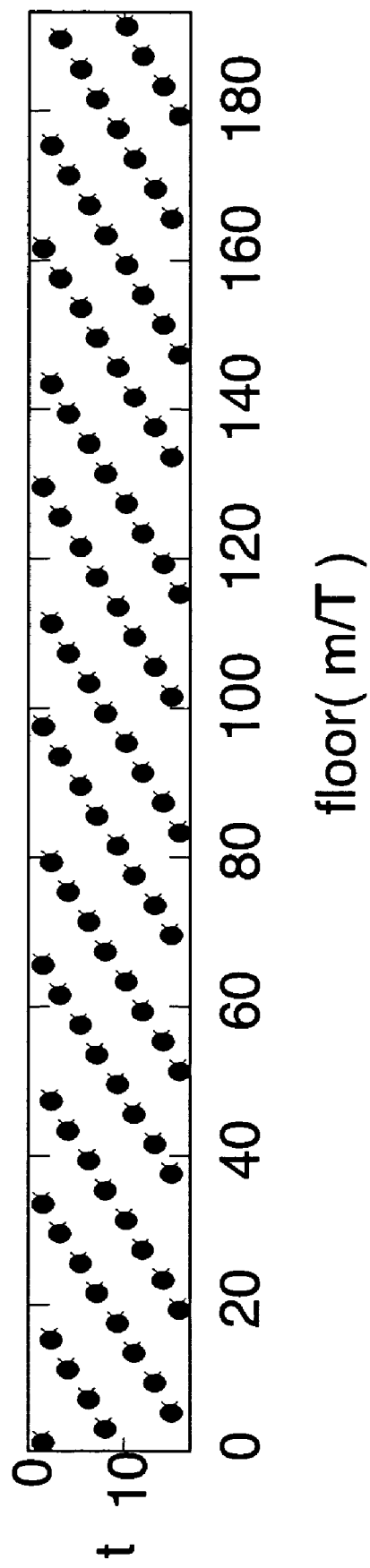
FIG. 11 illustrates an example of a distribution of subdata sets along 16 tracks of recording media based on PCO-interleaving.

In FIG. 11, the result of PCO-interleaving based on (7) is illustrated for a DS with S=32 SDSs by showing the data set layout along T=16 logical tracks. The $N_2=96$ PCOs of the SDS with SDS_number 0 are represented by dots and the 96 PCOs of SDS 1 are marked by crosses. Consecutive PCOs, denoted by dots and crosses in FIG. 11, correspond to COs, denoted by squares in FIG. 7. This illustrates the equivalence of the CO-interleaver (4) and the PCO-interleaver (7). In FIG. 11, the interleaver-granularity along tape is a PCO, i.e., the x-axis is measured in PCO lengths. As T=16 tracks are written concurrently, the PCO with CWI_number=m will be at location i=floor(m/T) from the beginning of the DS. The finer interleaver granularity by a factor of two has the advantage that during a rewrite PCOs are rewritten instead of COs, which allows one to reduce the loss due to rewrite by a factor of about two.

As is apparent from the data set layout, there are T PCOs that are written simultaneously onto the T logical tracks. Each such set of T PCOs is called a PCO set. There are $S \times N_2$ PCOs per data set and, hence, there are $S \times N_2/T$ PCO sets. All PCO sets in the data set layout are labeled from 0 to $S \times N_2/T-1$. Each CWI_number m determines a PCO-set index i=floor(m/T). Conversely, each CWI_number m is uniquely determined by the track number t and the PCO-set index i=floor(m/T). This "inverse map" is an equivalent way to characterize the PCO-interleaving. In particular, the inverse map of (7) is given by $$m = \text{mod}(i,2) + 2T\,\text{floor}(i/2) + 2\,\text{mod}(t-7\,\text{mod}(\text{floor}(i/2), T), T). \quad (8)$$

The CO-interleaver has a different granularity from the PCO-interleaver; the former is based on the natural ordering of CO-numbers n whereas the latter is based on the natural ordering of CWI_numbers m. The CO-formatter provides the link between CO-numbers and CWI_numbers. However, the relations (2) and (3) of the CO-formatter are not compatible with the natural ordering of CO_numbers and CWI_numbers. e.g., based on the CO_number ordering, the consecutive CWIs with indices 0 and 1 are not written simultaneously to tape. First, the CWI with index 0 is written simultaneously with the T−1 CWIs having CWI_numbers 2, 4, . . . , 2T−2; then, the CWI with index 1 is written simultaneously with the T−1 CWIs having CWI_numbers 3, 5, . . . , 2T−1. Thus, proceeding in sequential order of CO_numbers n for the generation of the DS layout is not the same as proceeding in sequential order of CWI_numbers m. To overcome this difference and to obtain identical DS layouts, one can apply a fixed permutation p to the set of all CWI indices, i.e., to the set $\{0, 1, \ldots, S \times N_2 \times 1\}$, which achieves the desired reordering. Specifically, this permutation is given by $$p(m) = 2T\,\text{floor}(m/(2T)) + T\,\text{mod}(m,2) + \text{floor}(\text{mod}(m, 2T)/2) \quad (9)$$

where mod(a,b) denotes the remainder of the division of a by b. Thus, when using CWI_numbers m as reference for the DS layout, the reordering permutation needs to be incorporated and the two functions in the general PCO-interleaver formula (6) are f(m)=p(m) and g(m)=floor(p(m)/2). This shows that the generalized CWI-interleaver can generate the same data set layout as the CO-interleaver, which is based on (4).

The design of PCO-interleavers above is based on (5) or (7). By modifying these equations, one can obtain alternative PCO-interleavers. The following provides a description of such an alternative PCO-interleaver for T=16 tracks, C2-length $N_2$=96 and S=32 subdata sets per data set. The "direct mapping" from CWI_number m to track number is defined by $$t = \text{mod}\{2\,\text{floor}(m/2) + 6\,\text{floor}(m/32) + \text{mod}[\text{floor}(m/16), 2] + \text{mod}[\text{floor}(m/256), 2] - 2\,\text{mod}[\text{floor}(m/256), 2] \times \text{mod}[\text{floor}(m/16), 2], 16\} \quad (10)$$

together with the PCO set assignment given by i=floor(m/T). The inverse interleaving map, which assigns a CWI_number m to every PCO-set index i and logical track t, is given by $$m = 32\,\text{floor}(i/2) + \text{mod}(i, 2) + 2\,\text{mod}[5\,\text{floor}(i/2) + \text{floor}(t/2), 8] + 16\,\text{mod}[\text{mod}(t, 2) + \text{mod}(\text{floor}(i/16), 2), 2] \quad (11)$$

This mapping is illustrated in TABLE 1. The shaded cells correspond to the PCOs of subdata set number 0. From TABLE 1, it is apparent how pairs of PCOs are grouped into COs by the CO formatter 914 shown in FIG. 9. Namely, for a fixed logical track number t, the two PCOs with PCO indices 2i and 2i+1 are combined into a CO and written onto tape in this order. For example, the two pairs of PCOs with CWI indices (16, 17) and (58, 59) are grouped into two consecutive COs and then written onto logical track t=1.

There are alternative ways to perform the grouping of pairs of PCOs into COs. For instance, the PCO pairs within each CO could be swapped and, thus, PCOs with odd PCO indices 2i+1 are written prior to those with even PCO indices 2i. Furthermore, such swapping could be a function of the PCO index i, say all PCOs are swapped within a CO if the PCO index i is in the ranges {32, 33, . . . , 63}, {96, 97, . . . , 127} and {160, 161, . . . , 191}. Such a specific swapping rule can easily be incorporated into the inverse interleaver map. For instance, the previous PCO-index-dependent swapping is obtained by replacing the term mod(i,2) on the right hand side of (11) by the term mod(mod(i,2)+mod(floor(i/32),2), 2). As a result, one obtains a modified CWI_Number Assignment table. This modified table differs from TABLE 1 by the swapping of all PCO pairs having a PCO index i in the ranges {32, 33, . . . , 63}, {96, 97, . . . , 127} and {160, 161, . . . , 191}.

TABLE 1

CWI_Number Assignement of the Alternative PCO-Interleaver with T = 16 Tracks, C2-Length $N_2$ = 96 and S = 32 Subdata Sets

| PCO Set No. | Track Number | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 16 | 2 | 18 | 4 | 20 | 6 | 22 | 8 | 24 | 10 | 26 | 12 | 28 | 14 | 30 |
| 1 | 1 | 17 | 3 | 19 | 5 | 21 | 7 | 23 | 9 | 25 | 11 | 27 | 13 | 29 | 15 | 31 |
| 2 | 42 | 58 | 44 | 60 | 46 | 62 | 32 | 48 | 34 | 50 | 36 | 52 | 38 | 54 | 40 | 56 |
| 3 | 43 | 59 | 45 | 61 | 47 | 63 | 33 | 49 | 35 | 51 | 37 | 53 | 39 | 55 | 41 | 57 |
| 4 | 68 | 84 | 70 | 86 | 72 | 88 | 74 | 90 | 76 | 92 | 78 | 94 | 64 | 80 | 66 | 82 |
| 5 | 69 | 85 | 71 | 87 | 73 | 89 | 75 | 91 | 77 | 93 | 79 | 95 | 65 | 81 | 67 | 83 |
| 6 | 110 | 126 | 96 | 112 | 98 | 114 | 100 | 116 | 102 | 118 | 104 | 120 | 106 | 122 | 108 | 124 |
| 7 | 111 | 127 | 97 | 113 | 99 | 115 | 101 | 117 | 103 | 119 | 105 | 121 | 107 | 123 | 109 | 125 |
| 8 | 136 | 152 | 138 | 154 | 140 | 156 | 142 | 158 | 128 | 144 | 130 | 146 | 132 | 148 | 134 | 150 |
| 9 | 137 | 153 | 139 | 155 | 141 | 157 | 143 | 159 | 129 | 145 | 131 | 147 | 133 | 149 | 135 | 151 |
| 10 | 162 | 178 | 164 | 180 | 166 | 182 | 168 | 184 | 170 | 186 | 172 | 188 | 174 | 190 | 160 | 176 |
| 11 | 163 | 179 | 165 | 181 | 167 | 183 | 169 | 185 | 171 | 187 | 173 | 189 | 175 | 191 | 161 | 177 |
| 12 | 204 | 220 | 206 | 222 | 192 | 208 | 194 | 210 | 196 | 212 | 198 | 214 | 200 | 216 | 202 | 218 |
| 13 | 205 | 221 | 207 | 223 | 193 | 209 | 195 | 211 | 197 | 213 | 199 | 215 | 201 | 217 | 203 | 219 |
| 14 | 230 | 246 | 232 | 248 | 234 | 250 | 236 | 252 | 238 | 254 | 224 | 240 | 226 | 242 | 228 | 244 |
| 15 | 231 | 247 | 233 | 249 | 235 | 251 | 237 | 253 | 239 | 255 | 225 | 241 | 227 | 243 | 229 | 245 |
| 16 | 272 | 256 | 274 | 258 | 276 | 260 | 278 | 262 | 280 | 264 | 282 | 266 | 284 | 268 | 286 | 270 |
| 17 | 273 | 257 | 275 | 259 | 277 | 261 | 279 | 263 | 281 | 265 | 283 | 267 | 285 | 269 | 287 | 271 |
| 18 | 314 | 298 | 316 | 300 | 318 | 302 | 304 | 288 | 306 | 290 | 308 | 292 | 310 | 294 | 312 | 296 |
| 19 | 315 | 299 | 317 | 301 | 319 | 303 | 305 | 289 | 307 | 291 | 309 | 293 | 311 | 295 | 313 | 297 |
| 20 | 340 | 324 | 342 | 326 | 344 | 328 | 346 | 330 | 348 | 332 | 350 | 334 | 336 | 320 | 338 | 322 |
| 21 | 341 | 325 | 343 | 327 | 345 | 329 | 347 | 331 | 349 | 333 | 351 | 335 | 337 | 321 | 339 | 323 |
| 22 | 382 | 366 | 368 | 352 | 370 | 354 | 372 | 356 | 374 | 358 | 376 | 360 | 378 | 362 | 380 | 364 |
| 23 | 383 | 367 | 369 | 353 | 371 | 355 | 373 | 357 | 375 | 359 | 377 | 361 | 379 | 363 | 381 | 365 |
| 24 | 408 | 392 | 410 | 394 | 412 | 396 | 414 | 398 | 400 | 384 | 402 | 386 | 404 | 388 | 406 | 390 |
| 25 | 409 | 393 | 411 | 395 | 413 | 397 | 415 | 399 | 401 | 385 | 403 | 387 | 405 | 389 | 407 | 391 |
| 26 | 434 | 418 | 436 | 420 | 438 | 422 | 440 | 424 | 442 | 426 | 444 | 428 | 446 | 430 | 432 | 416 |
| 27 | 435 | 419 | 437 | 421 | 439 | 423 | 441 | 425 | 443 | 427 | 445 | 429 | 447 | 431 | 433 | 417 |
| 28 | 476 | 460 | 478 | 462 | 464 | 448 | 466 | 450 | 468 | 452 | 470 | 454 | 472 | 456 | 474 | 458 |
| 29 | 477 | 461 | 479 | 463 | 465 | 449 | 467 | 451 | 469 | 453 | 471 | 455 | 473 | 457 | 475 | 459 |
| 30 | 502 | 486 | 504 | 488 | 506 | 490 | 508 | 492 | 510 | 494 | 496 | 480 | 498 | 482 | 500 | 484 |
| 31 | 503 | 487 | 505 | 489 | 507 | 491 | 509 | 493 | 511 | 495 | 497 | 481 | 499 | 483 | 501 | 485 |
| 32 | 512 | 528 | 514 | 530 | 516 | 532 | 518 | 534 | 520 | 536 | 522 | 538 | 524 | 540 | 526 | 542 |
| 33 | 513 | 529 | 515 | 531 | 517 | 533 | 519 | 535 | 521 | 537 | 523 | 539 | 525 | 541 | 527 | 543 |
| 34 | 554 | 570 | 556 | 572 | 558 | 574 | 544 | 560 | 546 | 562 | 548 | 564 | 550 | 566 | 552 | 568 |
| 35 | 555 | 571 | 557 | 573 | 559 | 575 | 545 | 561 | 547 | 563 | 549 | 565 | 551 | 567 | 553 | 569 |
| 36 | 580 | 596 | 582 | 598 | 584 | 600 | 586 | 602 | 588 | 604 | 590 | 606 | 576 | 592 | 578 | 594 |
| 37 | 581 | 597 | 583 | 599 | 585 | 601 | 587 | 603 | 589 | 605 | 591 | 607 | 577 | 593 | 579 | 595 |
| 38 | 622 | 638 | 608 | 624 | 610 | 626 | 612 | 628 | 614 | 630 | 616 | 632 | 618 | 634 | 620 | 636 |
| 39 | 623 | 639 | 609 | 625 | 611 | 627 | 613 | 629 | 615 | 631 | 617 | 633 | 619 | 635 | 621 | 637 |
| 40 | 648 | 664 | 650 | 666 | 652 | 668 | 654 | 670 | 640 | 656 | 642 | 658 | 644 | 660 | 646 | 662 |
| 41 | 649 | 665 | 651 | 667 | 653 | 669 | 655 | 671 | 641 | 657 | 643 | 659 | 645 | 661 | 647 | 663 |
| 42 | 674 | 690 | 676 | 692 | 678 | 694 | 680 | 696 | 682 | 698 | 684 | 700 | 686 | 702 | 672 | 688 |
| 43 | 675 | 691 | 677 | 693 | 679 | 695 | 681 | 697 | 683 | 699 | 685 | 701 | 687 | 703 | 673 | 689 |
| 44 | 716 | 732 | 718 | 734 | 704 | 720 | 706 | 722 | 708 | 724 | 710 | 726 | 712 | 728 | 714 | 730 |
| 45 | 717 | 733 | 719 | 735 | 705 | 721 | 707 | 723 | 709 | 725 | 711 | 727 | 713 | 729 | 715 | 731 |
| 46 | 742 | 758 | 744 | 760 | 746 | 762 | 748 | 764 | 750 | 766 | 736 | 752 | 738 | 754 | 740 | 756 |
| 47 | 743 | 759 | 745 | 761 | 747 | 763 | 749 | 765 | 751 | 767 | 737 | 753 | 739 | 755 | 741 | 757 |
| 48 | 784 | 768 | 786 | 770 | 788 | 772 | 790 | 774 | 792 | 776 | 794 | 778 | 796 | 780 | 798 | 782 |

After PCO-interleaving or CO-interleaving illustrated by FIG. 9 and FIG. 3, respectively, and before writing the COs onto tape, the COs are modulation encoded and transformed into synchronized codeword object (SCO) structures by inserting VFO, forward, resync and reverse sync fields (see FIGS. 12 and 13). In LTO-4, the headers and CWI-2s, which are called codeword pairs, are passed through a rate-16/17 RLL encoder resulting in RLL-encoded bit-sequences of length 85 and 4080, respectively. More generally, the CO structures can be modulation encoded using an RLL-encoder of rate $R_H$ for the header portion and an RLL-encoder of rate R for the CWIs. For the CWI-4 based CO structure, the resulting SCO-structure is illustrated in FIG. 13, where the VFO, forward sync, re-sync and reverse sync fields have some suitable lengths $L_{VFO}$, $L_{FS}$, $L_{RS}$, and $L_{FS}$, respectively.

The interleaving scheme described herein is intended to provide robustness against dead tracks and an increased robustness against stripe errors (that is, errors across all tracks). The robustness of an ECC/CO-interleaving scheme or ECC/PCO-interleaving scheme against stripe errors depends on three factors: (i) the parameters $[N_2, K_2, d_{min}]$ of the C2-code, (ii) the interleaving depth given by the number S of subdata sets (SDS) within each Data Set (DS), and (iii) the number T of parallel channels (tracks).

In case of a stripe error, a decoder will operate as follows. The C1-decoder detects that certain rows in a number of subdata sets are uncorrectable and provides erasure-flags of these rows to the C2-decoder. The C2-decoder performs erasure-decoding and can correct up to $N_2-K_2-M$ erasures per subdata set while keeping a margin of M bytes to avoid miscorrections. If a stripe error along tape extends over no more than $(S/2)\times(N_2-K_2-M)/T$ SCOs, then there are no more than $(S/2)\times(N_2-K_2-M)$ COs which are affected by errors and these erroneous COs are evenly distributed by the inverse CO-interleaving map over the S/2 pairs of subdata sets of an affected DS. In case of PCO-interleaving, the erroneous $(S/2)\times(N_2-K_2-M)$ COs correspond to $S\times(N_2-K_2-M)$ PCOs, which are evenly distributed by the inverse PCO-interleaving map over S subdata sets. Thus, in both cases, each subdata set will contain at most $N_2-K_2-M$ erased rows, which can be corrected and, therefore, the maximum stripe error length (MSEL) in terms of SCO units is given by $$MSEL=S\times(N_2-K_2-M)/(2T). \quad (12)$$

Note that the absolute length of the MSEL along the tape [in mm] depends on the length of the SCO [in mm].

The maximum number of dead tracks (MNDT) that can be tolerated in the absence of channel errors can be derived in a similar manner. Specifically, the formula $$MNDT=floor((N_2-K_2)/(N_2/T)) \quad (13)$$

can be used to compute the maximum number of dead tracks.

In terms of MSEL and MNDT properties, the CO-interleaver (4) and the PCO-interleaver based on (5) or (7) are equivalent. Thus, TABLES II-III below are valid for both CO-interleaving and PCO-interleaving.

Based on the synchronized codeword quad (SCQ), which is the SCO structure of LTO-4, TABLE 2 shows specific configurations of C2-code designs and properties with regard to maximum stripe error length and dead track support. In TABLE 2, an erasure-correction margin of M=2 was assumed. All C2-codes with $N_2>64$ have 3.7% improved format efficiency (FE) when compared to the C2-code in LTO-4 (see first row in TABLE 2). It should be emphasized that in all these cases the results hold for the CO-interleaving formula (4) or the PCO-interleaving formula (5) or (7).

TABLE 2

Specific C2-Code Configurations for CWI-2-Based SCO-Structures

| $N_2$ | $K_2$ | Tracks T | S | Relative DS size | FE in % | MSEL in SCQs | Dead tracks |
|---|---|---|---|---|---|---|---|
| 64 | 54 | 16 | 64 | 1X | 0 | 16 | 2 |
| 128 | 112 | 16 | 32 | 1X | 3.7 | 14 | 2 |
| 128 | 112 | 16 | 64 | 2X | 3.7 | 28 | 2 |
| 128 | 112 | 32 | 64 | 2X | 3.7 | 14 | 4 |
| 128 | 112 | 32 | 128 | 4X | 3.7 | 28 | 4 |
| 96 | 84 | 16 | 64 | 1.5X | 3.7 | 20 | 2 |
| 96 | 84 | 24 | 96 | 2.25X | 3.7 | 20 | 3 |
| 96 | 84 | 32 | 128 | 3X | 3.7 | 20 | 4 |
| 192 | 168 | 16 | 32 | 1.5X | 3.7 | 22 | 2 |
| 192 | 168 | 24 | 48 | 2.25X | 3.7 | 22 | 3 |
| 192 | 168 | 32 | 64 | 3X | 3.7 | 22 | 4 |

In TABLE 3, the results are summarized for two embodiments of C2-codes for T=16 parallel tracks and SCO-structures, which are based on CWI-4s. Note that the scheme ECC-1 with the C2-code of length 96 can be implemented either with the PCO-interleaver (5) or (7) or by applying the alternative PCO-interleaver specified in TABLE 1. The resulting three interleavers achieve the same MSEL and the MNDT. The length of a CWI-4 [in mm] is roughly twice as long as that of a CWI-2. Thus, a maximum stripe error length of say 20 SCQs is comparable to 10 SCOs in TABLES 2 and 3, respectively.

TABLE 3

Proposed C2-Code Configurations for CWI-4-Based SCO-Structures and T = 16 Tracks

| Code | $N_2$ | $K_2$ | S | Relative DS size | FE in % | MSEL in SCOs | Dead tracks |
|---|---|---|---|---|---|---|---|
| ECC-1 | 96 | 84 | 32 | 1.5X | 3.7 | 10 | 2 |
| ECC-2 | 192 | 168 | 32 | 3X | 3.7 | 22 | 2 |

Figure 14:
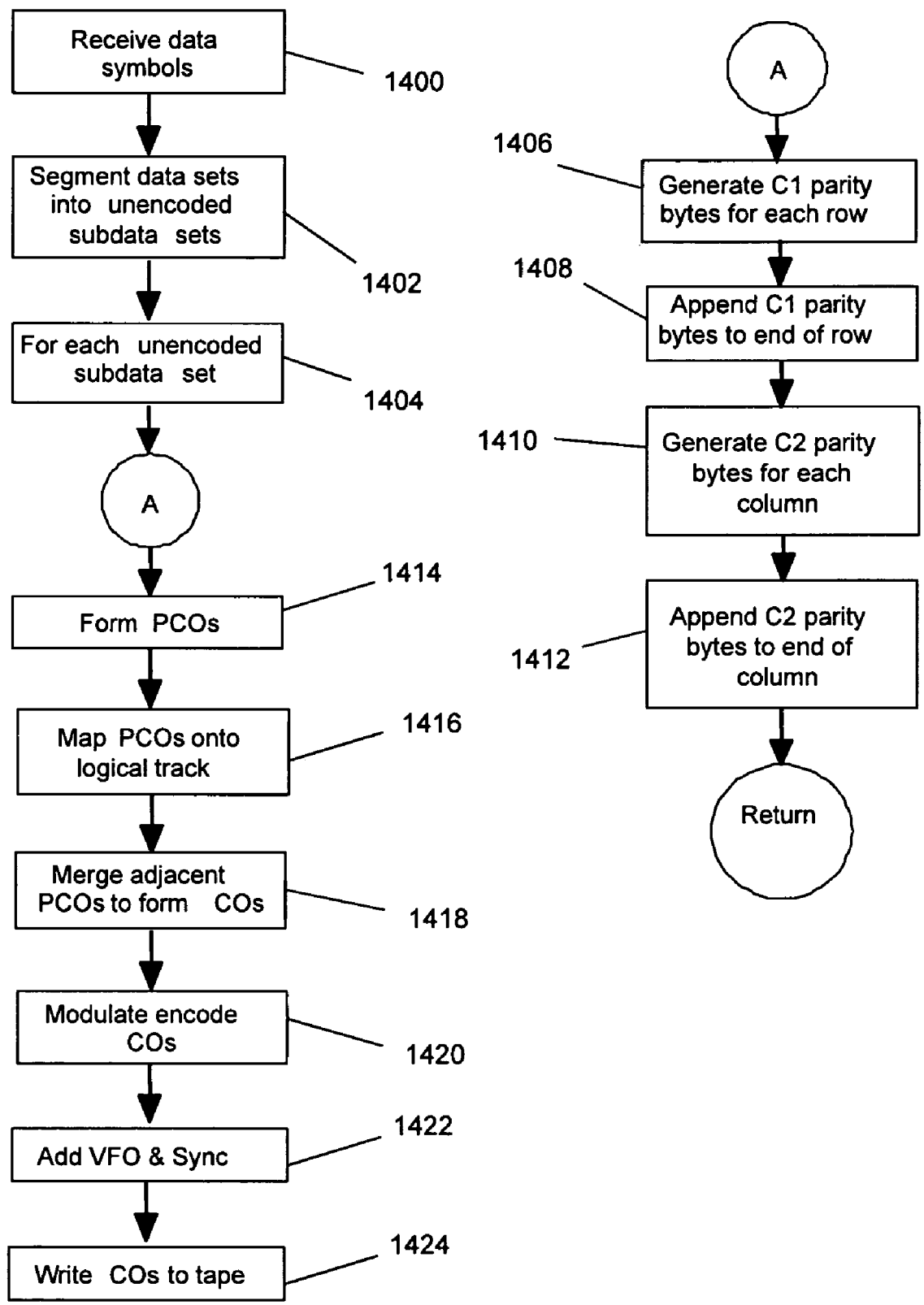
FIG. 14 is a flow chart illustrating the encoding processes and the generation of PCOs, COs and synchronized COs.

The flow chart of FIG. 14 summarizes the foregoing process. A stream of user data symbols is received from a host, the stream including at least one data set (step 1400). Each data set is segmented into a plurality S of unencoded subdata sets, each subdata set comprising an array having $K_2$ rows and $K_1$ columns (step 1402). Each unencoded subdata set is then encoded (step 1404). For each row of each unencoded subdata set, $N_1-K_1$ C1-parity bytes are generated (step 1406) and appended to the end of the row to form an encoded C1 codeword having a length $N_1$ (step 1408). In addition, for each column of each unencoded subdata set, $N_2-K_2$ C2-parity bytes are generated (step 1410) and appended to the end of the row to form an encoded C2 codeword having a length $N_2$ (step 1412). Thus, an encoded subdata set is generated having $N_2$ C1 codewords.

After all of the S unencoded subdata sets have been encoded, a plurality of $(S\times N_2)$ partial codeword objects (PCOs) are formed from the encoded subdata sets, each comprising a header and a C1 codeword (step 1414). Each PCO is then mapped onto a logical data track according to information within the header of the PCO (step 1416) and, on each logical data track, adjacent PCOs are merged to form codeword objects (COs), each comprising at least two adjacent PCOs (step 1418). The COs are modulation encoded (step 1420) and VFO and synchronization patterns are added to obtain T synchronized COs, where T is the number of concurrent active tracks on the data tape, (step 1422). The T synchronized COs are then written simultaneously to the data tape (step 1424).

For the same C2-code and the same number S of SDSs per data set, the PCO-interleaving scheme described herein provides the same MSEL and MNDT properties as CO-interleaving. Thus, both schemes have the same robustness against stripe errors and dead tracks. One benefit of the PCO-based scheme is the smaller granularity of the rewritten objects, which are PCOs rather than COs, in case of rewrites.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable storage media include recordable-type media such as a floppy disk, a hard disk drive, a RAM, and CD-ROMs.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for writing data to a multi-track data tape medium or a method for deploying computing infrastructure comprising integrating computer readable code into a computing system for writing data to a multi-track data tape medium.

What is claimed is:

1. A method for writing data to a multi-track data tape, comprising:
   receiving a stream of user data symbols, the stream comprising at least one data set;
   segmenting each data set into a plurality S of unencoded subdata sets, each subdata set comprising an array having $K_2$ rows and $K_1$ columns;
   for each unencoded subdata set:
      generating $N_1$-$K_1$ C1-parity bytes for each row of a subdata set and appending the C1-parity bytes to the end of the row to form an encoded C1 codeword having a length $N_1$; and
      generating $N_2$-$K_2$ C2-parity bytes for each column of the subdata set and appending the C2-parity bytes to the end of the column to form an encoded C2 codeword having a length $N_2$, whereby an encoded subdata set is generated having $N_2$ C1 codewords;
   from the S encoded subdata sets, forming a plurality of (S×$N_2$) partial codeword objects (PCOs), each comprising a header and a C1 codeword;
   mapping each PCO onto a logical data track according to information within the header of the PCO;
   on each logical data track, merging adjacent PCOs to form codeword objects (COs), each comprising at least two adjacent PCOs;
   modulation encoding the COs and adding synchronization patterns to obtain T synchronized COs, where T is the number of concurrent active tracks on the data tape; and
   writing T synchronized COs simultaneously to the data tape.

2. The method of claim 1, wherein mapping each PCO comprises assigning to each PCO with index m=CWI_number a logical track number t based on the formula t=mod(7 floor(f(m)/S)+g(m), T), where floor(x) denotes the integer part of the real number x and mod(a,T) denotes the remainder of the division by T, where the remainder is in the range 0, 1, . . . , T-1.

3. The method of claim 2, wherein f(m)=m and g(m)=m.

4. The method of claim 2, wherein f(m)=m and g(m)=floor(m/2).

5. The method of claim 2, further comprising writing a PCO with CWI_number=m to the tape at location i=floor(m/T).

6. The method of claim 2, mapping each PCO onto a logical data track is characterized by m=mod(i,2)+2T floor(i/2)+2 mod(t−7 mod(floor(i/2), T), T), where PCO-set index i=floor(m/T).

7. The method of claim 1, wherein T=16, $N_2$=96 and S=32, and wherein further mapping each PCO comprises mapping a PCO from a CW interleave number m to a track number according to t=mod{2 floor(m/2)+6 floor(m/32)+mod[floor(m/16),2]+mod[floor(m/256), 2]−2 mod[floor(m/256), 2]×mod[floor(m/16), 2], 16}.

8. The method of claim 7, mapping each PCO onto a logical data track is characterized by m=32 floor(i/2)+mod(i,2)+2 mod[5 floor(i/2)+floor(t/2), 8]+16 mod[mod(t,2)+mod(floor(i /16), 2), 2].

9. A data storage tape device, comprising:
   a host interface through which a stream of user data symbols comprising a data set is received;
   a segmenting module operable to segment the data set into a plurality S of unencoded subdata sets, each subdata set comprising a array having $K_2$ rows and $K_1$ columns;
   a C1 encoder operable to generate $N_1$-$K_1$ C1-parity bytes for each row of a subdata set and append the C1-parity bytes to the end of the row to form an encoded C1 codeword having a length $N_1$;
   a C2 encoder operable to generate $N_2$-$K_2$ C2-parity bytes for each column of the subdata set and append the C2-parity bytes to the end of the column to form an encoded C2 codeword having a length $N_2$, whereby an encoded subdata set is generated having $N_2$ C1 codewords;
   a partial codeword object (PCO) formatter operable to form a plurality of (S×$N_2$) PCOs, each comprising a header and a C1 codeword, from the S encoded subdata sets;
   a PCO interleaver operable to map each PCO onto a logical data track according to information within the header of the PCO;
   a codeword object formatter operable on each logical data track, to merge adjacent PCOs into COs, each comprising at least two adjacent PCOs;
   a modulation encoder operable to encode the COs into synchronized COs; and
   a write channel, including a write head, operable to write T synchronized COs simultaneously to the tape, where T equals the number of concurrent active tracks on a data storage tape.

10. The data storage tape device of claim 9, wherein the PCO interleaver is operable to map each PCO onto a logical data track by assigning to each PCO with index m=CWI_number a logical track number t based on the formula t=mod(7 floor(f(m)/S)+g(m), T), where floor(x) denotes the integer part of the real number x and mod(a,T) denotes the remainder of the division by T, where the remainder is in the range 0, 1, ..., T−1.

11. The data storage tape device of claim 10, wherein f(m)=m and g(m)=m.

12. The data storage tape device of claim 10, wherein f(m)=m and g(m)=floor(m/2).

13. The data storage tape device of claim 10, wherein the write channel write T synchronized COs simultaneously to the tape by a PCO with CWI_number=m to the tape at location i=floor(m/T).

14. The data storage tape device of claim 9, wherein T=16, $N_2$=96 and S=32, and wherein further the PCO interleaver maps each PCO by mapping a PCO from a CW interleave number m to a track number according to t=mod{2 floor(m/2)+6 floor(m/32)+mod[floor(m/16),2]+mod[floor(m/256), 2]−2 mod[floor(m/256), 2]×mod[floor(m/16), 2], 16}.

15. The data storage tape device of claim 14, wherein the PCO interleaver maps each PCO onto a logical data track is characterized by m=32 floor(i/2)+mod(i,2)+2 mod[5 floor(i/2)+floor(t/2), 8]+16 mod[mod(t,2)+mod(floor(i/16), 2), 2].

16. A computer program product of a computer readable medium usable with a programmable computer, the computer program product having computer-readable code embodied therein for writing data to a multi-track data tape, the computer-readable code comprising instructions for:
receiving a stream of user data symbols, the stream comprising at least one data set;
segmenting each data set into a plurality S of unencoded subdata sets, each subdata set comprising an array having $K_2$ rows and $K_1$ columns;
for each unencoded subdata set:
generating $N_1$-$K_1$ C1-parity bytes for each row of a subdata set and appending the C1-parity bytes to the end of the row to form an encoded C1 codeword having a length $N_1$; and
generating $N_2$-$K_2$ C2-parity bytes for each column of the subdata set and appending the C2-parity bytes to the end of the column to form an encoded C2 codeword having a length $N_2$, whereby an encoded subdata set is generated having $N_2$ C1 codewords;
from the S encoded subdata sets, forming a plurality of (S×$N_2$) partial codeword objects (PCOs), each comprising a header and a C1 codeword;
mapping each PCO onto a logical data track according to information within the header of the PCO;
on each logical data track, merging adjacent PCOs to form codeword objects (COs), each comprising at least two adjacent PCOs;
modulation encoding the COs and adding synchronization patterns to obtain T synchronized COs, where T is the number of concurrent active tracks on the data tape; and
writing T synchronized COs simultaneously to the data tape.

17. The computer program product of claim 16, wherein the instructions for mapping each PCO comprise instructions for assigning to each PCO with index m=CWI_number a logical track number t based on the formula t=mod(7 floor(f(m)/S)+g(m), T), where floor(x) denotes the integer part of the real number x and mod(a,T) denotes the remainder of the division by T, where the remainder is in the range 0, 1, ..., T−1.

18. The computer program product of claim 17, wherein f(m)=m and g(m)=m.

19. The computer program product of claim 17, wherein f(m)=m and g(m)=floor(m/2).

20. The computer program product of claim 17, further comprising instructions for writing a PCO with CWI_number=m to the tape at location i=floor(m/T).

21. The computer program product of claim 17, mapping each PCO onto a logical data track is characterized by m=mod (i,2)+2T floor(i/2)+2 mod(t−7 mod(floor(i/2), T), T), where PCO-set index i=floor(m/T).

22. The computer program product of claim 16, wherein T=16, $N_2$=96 and S=32, and wherein further the instructions for mapping each PCO comprise instructions for mapping a PCO from a CW interleave number m to a track number according to t=mod{2 floor(m/2)+6 floor(m/32)+mod[floor(m/16),2]+mod[floor(m/256), 2]−2 mod[floor(m/256), 2]×mod[floor(m/16), 2], 16}.

23. The computer program product of claim 22, mapping each PCO onto a logical data track is characterized by m=32 floor(i/2)+mod(i,2)+2 mod[5 floor(i/2)+floor(t/2), 8]+16 mod[mod(t,2)+mod(floor(i/16), 2), 2].

24. An apparatus for encoding a stream of user data symbols comprising a data set, comprising:
a segmenting module operable to segment the data set into a plurality S of unencoded subdata sets, each subdata set comprising a array having $K_2$ rows and $K_1$ columns;
a C1 encoder operable to generate $N_1$-$K_1$ C1-parity bytes for each row of a subdata set and append the C1-parity bytes to the end of the row to form an encoded C1 codeword having a length $N_1$;
a C2 encoder operable to generate $N_2$-$K_2$ C2-parity bytes for each column of the subdata set and append the C2-parity bytes to the end of the column to form an encoded C2 codeword having a length $N_2$, whereby an encoded subdata set is generated having $N_2$ C1 codewords;
a partial codeword object interleaver operable to map each PCO onto a logical data track according to information within the header of the PCO;
a codeword object formatter operable on each logical data track, to merge adjacent PCOs into COs, each comprising at least two adjacent PCOs; and
a modulation encoder operable to encode the COs into synchronized COs.

25. The data storage tape device of claim 24, wherein the PCO interleaver is operable to map each PCO onto a logical data track by assigning to each PCO with index m=CWI_number a logical track number t based on the formula t=mod(7 floor(f(m)/S)+g(m), T), where floor(x) denotes the integer part of the real number x and mod(a,T) denotes the remainder of the division by T, where the remainder is in the range 0,1, ..., T−1.

26. The data storage tape device of claim 25, wherein f(m)=m and g(m)=m.

27. The data storage tape device of claim 25, wherein f(m)=m and g(m)=floor(m/2).

28. The data storage tape device of claim 25, wherein the write channel write T synchronized COs simultaneously to the tape by a PCO with CWI_number=m to the tape at location i=floor(m/T).

29. The data storage tape device of claim 24, wherein T=16, $N_2$=96 and S=32, and wherein further the PCO interleaver maps each PCO by mapping a PCO from a CW interleave number m to a track number according to t=mod{2 floor(m/2)+6 floor(m/32)+mod[floor(m/16),2]+mod[floor(m/256), 2]−2 mod[floor(m/256), 2]×mod[floor(m/16), 2], 16}.

30. The data storage tape device of claim 29, wherein the PCO interleaver maps each PCO onto a logical data track is characterized by m=32 floor(i/2)+mod(i,2)+2 mod[5 floor(i/2)+floor(t/2), 8]+16 mod[mod(t,2)+mod(floor(i /16), 2), 2].

31. A method for deploying computing infrastructure, comprising integrating computer readable code into a computing system, wherein the code, in combination with the computing system, is capable of performing the following:

receiving a stream of user data symbols, the stream comprising at least one data set;

segmenting each data set into a plurality S of unencoded subdata sets, each subdata set comprising an array having $K_2$ rows and $K_1$ columns;

for each unencoded subdata set:

generating $N_1$-$K_1$ C1-parity bytes for each row of a subdata set and appending the C1-parity bytes to the end of the row to form an encoded C1 codeword having a length $N_1$; and generating $N_2$-$K_2$ C2-parity bytes for each column of the subdata set and appending the C2-parity bytes to the end of the column to form an encoded C2 codeword having a length $N_2$, whereby an encoded subdata set is generated having $N_2$ C1 codewords;

from the S encoded subdata sets, forming a plurality of (S×$N_2$) partial codeword objects (PCOs), each comprising a header and a C1 codeword;

mapping each PCO onto a logical data track according to information within the header of the PCO;

on each logical data track, merging adjacent PCOs to form codeword objects (COs), each comprising at least two adjacent PCOs;

modulation encoding the COs and adding synchronization patterns to obtain T synchronized COs, where T is the number of concurrent active tracks on the data tape; and writing T synchronized COs simultaneously to the data tape.

32. The method of claim 31, wherein mapping each PCO comprises assigning to each PCO with index m=CWI_number a logical track number t based on the formula t=mod(7 floor(f(m)/S)+g(m), T), where floor(x) denotes the integer part of the real number x and mod(a,T) denotes the remainder of the division by T, where the remainder is in the range 0, 1, . . . , T−1.

33. The method of claim 32, further comprising writing a PCO with CWI_number=m to the tape at location i=floor(m/T).

34. The method of claim 32, mapping each PCO onto a logical data track is characterized by m=mod(i,2)+2T floor(i/2)+2 mod(t−7 mod(floor(i /2), T), T), where PCO-set index i=floor(m/T).

35. The method of claim 31, wherein T=16, $N_2$=96 and S=32, and wherein further mapping each PCO comprises mapping a PCO from a CW interleave number m to a track number according to t=mod{2 floor(m/2)+6 floor(m/32)+mod[floor(m/16),2]+mod[floor(m/256), 2]−2 mod[floor(m/256), 2]×mod[floor(m/16), 2], 16}.

* * * * *